(12) United States Patent
Ito et al.

(10) Patent No.: US 7,473,749 B2
(45) Date of Patent: Jan. 6, 2009

(54) PREPARATION OF TOPCOAT COMPOSITIONS AND METHODS OF USE THEREOF

(75) Inventors: Hiroshi Ito, San Jose, CA (US); Linda Karin Sundberg, Los Gatos, CA (US)

(73) Assignee: International Business Machines Corporation, Armonk, NY (US)

( * ) Notice: Subject to any disclaimer, the term of this patent is extended or adjusted under 35 U.S.C. 154(b) by 193 days.

(21) Appl. No.: 11/159,477

(22) Filed: Jun. 23, 2005

(65) Prior Publication Data

US 2006/0292484 A1 Dec. 28, 2006

(51) Int. Cl.
C07C 69/52 (2006.01)

(52) U.S. Cl. .................... 526/245; 430/270.1; 526/247; 526/319

(58) Field of Classification Search ................. 526/245, 526/247, 319; 430/270.1
See application file for complete search history.

(56) References Cited

U.S. PATENT DOCUMENTS

| | | | | |
|---|---|---|---|---|
| 6,509,134 | B2 * | 1/2003 | Ito et al. | 430/270.1 |
| 6,548,219 | B2 * | 4/2003 | Ito et al. | 430/270.1 |
| 6,610,456 | B2 * | 8/2003 | Allen et al. | 430/270.1 |
| 6,806,026 | B2 * | 10/2004 | Allen et al. | 430/270.1 |
| 6,864,037 | B2 * | 3/2005 | Hatakeyama et al. | 430/270.1 |
| 7,150,957 | B2 * | 12/2006 | DiPietro et al. | 430/281.1 |
| 2002/0058198 | A1 * | 5/2002 | Klauck-Jacobs et al. | 430/270.1 |
| 2003/0078352 | A1 * | 4/2003 | Miyazawa et al. | 526/245 |
| 2003/0165773 | A1 | 9/2003 | Harada et al. | 430/270.1 |
| 2004/0157151 | A1 | 8/2004 | Yoon et al. | 430/270.1 |
| 2004/0166434 | A1 | 8/2004 | Dammel et al. | 430/270.1 |
| 2004/0175644 | A1 | 9/2004 | Abdourazak et al. | 430/270.1 |
| 2004/0191674 | A1 | 9/2004 | Hanamoto et al. | 430/270.1 |
| 2004/0192867 | A1 | 9/2004 | Narita et al. | 526/242 |
| 2004/0236046 | A1 | 11/2004 | Miyazawa et al. | |

OTHER PUBLICATIONS

Ito et al., J. Poly. Sci., Poly. Chem.; vol. 42(6), pp. 1468-1477; Mar. 15, 2004.*
Ito et al., J. Poly. Sci., Poly. Chem.; vol. 42(6), pp. 1478-1505; Mar. 15, 2004.*

* cited by examiner

*Primary Examiner*—Peter D. Mulcahy
*Assistant Examiner*—Henry Hu
(74) *Attorney, Agent, or Firm*—Schmeiser, Olsen & Watts

(57) ABSTRACT

A topcoat composition that includes a fluorine-containing polymer and a casting solvent selected from an alcohol is provided. Also provided is a method of forming an image on a photoresist that includes forming a photoresist over a substrate; applying a topcoat composition, the topcoat composition comprising at least one fluorine-containing polymer and a casting solvent, onto the photoresist; removing the casting solvent of the topcoat composition resulting in the formation of a topcoat material over the photoresist; exposing the photoresist to radiation, the radiation changing a chemical composition of the regions of the photoresist exposed to the radiation, forming exposed and unexposed regions in the photoresist; and removing i) the topcoat material and ii) the exposed regions of the photoresist or the unexposed regions of the photoresist.

9 Claims, 10 Drawing Sheets

PREPARATION OF TOPCOAT COMPOSITIONS AND METHODS OF USE THEREOF

FIELD OF THE INVENTION

The present invention relates to the field of photolithography; more specifically, it relates to a topcoat composition and methods of use thereof in photolithographic imaging.

BACKGROUND OF THE INVENTION

Immersion photolithography at 193 nanometers (nm) is considered to be the most viable next generation technology for semiconductor device fabrication. Immersion photolithography provides high resolution and depth of focus of photolithographic images. Water is placed in a space between a lens and a photoresist layer. In this configuration, however, the water could degrade the photoresist performance by diffusing into the photoresist layer and extracting photoresist components such as an acid generator, a base quencher and other key components. Therefore, a need exists for a topcoat material and a method of use thereof that overcomes at least one of the aforementioned deficiencies.

SUMMARY OF THE INVENTION

A first aspect of the present invention is a topcoat composition comprising: at least one fluorine-containing polymer represented by the formula (1) or (2):

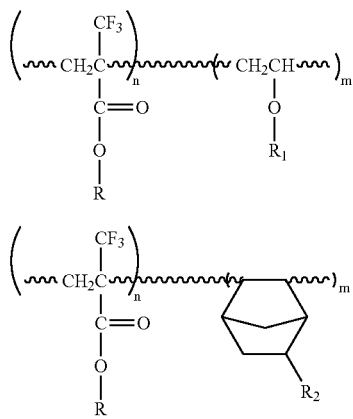

wherein R is a fluoroalcohol group or a Hydrogen atom, wherein $R_1$ is a fluoroalcohol group, a linear alkyl group, a branched alkyl group, a linear fluoroalkyl group, a branched fluoroalkyl group, or a Hydrogen atom, wherein $R_2$ is a fluoroalcohol group, a linear alkyl group, a branched alkyl group, a linear fluoroalkyl group, a branched fluoroalkyl group, or a Hydrogen atom, and wherein n and m represent respective molar fractions such that $n+m=1$; and a casting solvent comprising an alcohol.

A second aspect of the present invention is a method of forming an image on a photoresist comprising: forming a photoresist over a substrate; applying a topcoat composition, said topcoat composition comprising at least one fluorine-containing polymer represented by the formula (1) or (2):

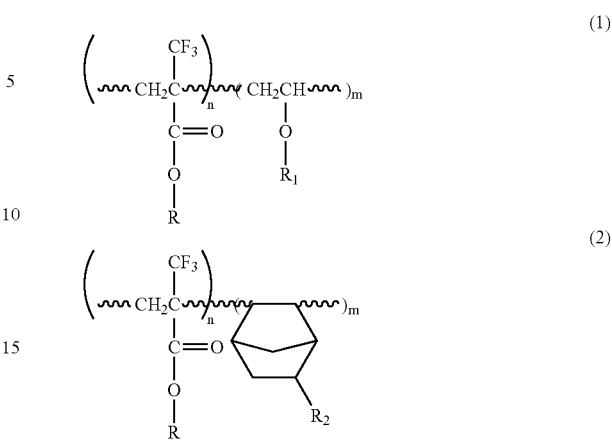

wherein R is a fluoroalcohol group or a Hydrogen atom, wherein $R_1$ is a fluoroalcohol group, a linear alkyl group, a branched alkyl group, a linear fluoroalkyl group, a branched fluoroalkyl group, or a Hydrogen atom, wherein $R_2$ is a fluoroalcohol group, a linear alkyl group, a branched alkyl group, a linear fluoroalkyl group, a branched fluoroalkyl group, or a Hydrogen atom, and wherein n and m represent respective molar fractions such that $n+m=1$, and a casting solvent comprising an alcohol, onto said photoresist; removing said casting solvent of said topcoat composition resulting in the formation of a topcoat material over said photoresist; exposing said photoresist to radiation, thereby forming exposed and unexposed regions in said photoresist, said radiation changing the chemical composition of said photoresist in said exposed regions; and removing i) said topcoat material and ii) either said exposed regions of said photoresist or said unexposed regions of said photoresist.

A third aspect of the present invention is a method comprising: applying a polar solvent with a base-soluble material dispersed therein over a photoresist; removing said polar solvent resulting in the formation of a topcoat over said photoresist; and exposing at least a portion of the photoresist to imaging radiation to form a latent image therein; and removing said topcoat.

A fourth aspect of the present invention is a topcoat composition comprising: a copolymer having at least a 2-trifluoromethylacrylic repeating unit containing a hexafluoroalcohol group or hydrogen, wherein said copolymer is soluble in an alcohol and an aqueous base; and a casting solvent comprising said alcohol.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

Figure 1:
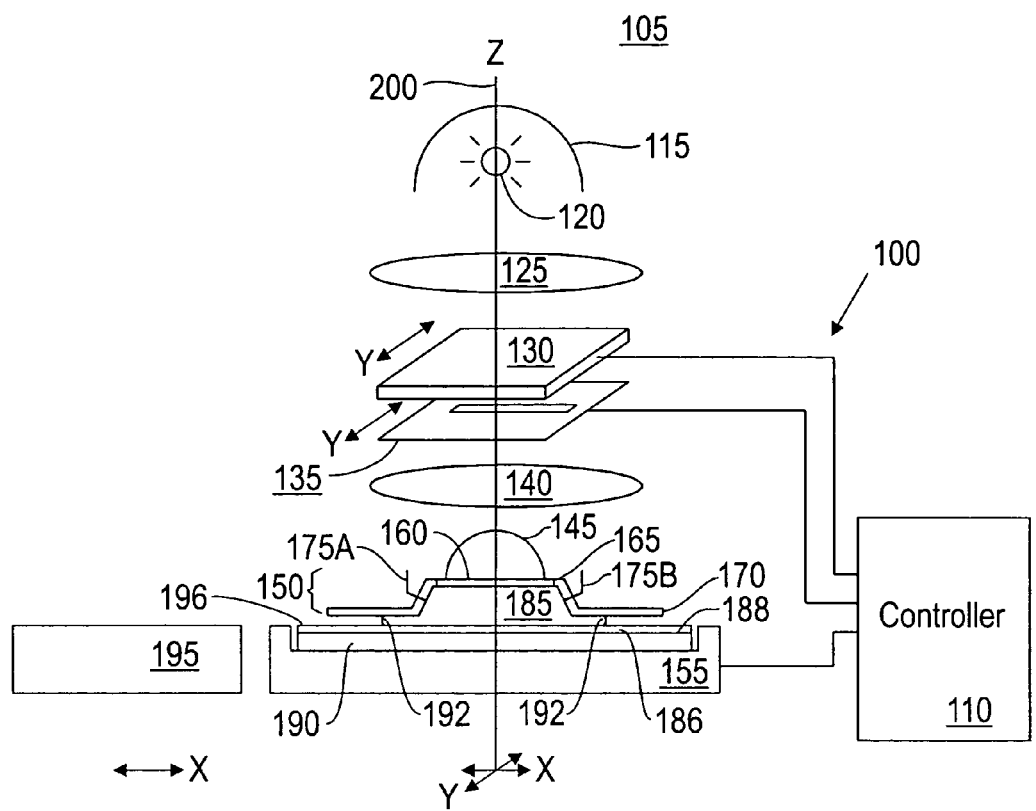
FIG. 1 depicts a diagram of an immersion photolithographic system that may be used to process a semiconductor wafer with a topcoat, in accordance with the present invention.

Although certain embodiments of the present invention will be shown and described in detail, it should be understood that various changes and modifications may be made without departing from the scope of the appended claims. The scope of the present invention will in no way be limited to the number of constituting components, the materials thereof, the shapes thereof, the relative arrangement thereof, etc., and are disclosed simply as an example of an embodiment. The features and advantages of the present invention are illustrated in detail in the accompanying drawings, wherein like reference numerals refer to like elements throughout the drawings. Although the drawings are intended to illustrate the present invention, the drawings are not necessarily drawn to scale.

SYNTHESIS EXAMPLES

BHFACHTFMA (3,5-bis(hexafluoro-2-hydroxy-2-propyl)cyclohexyl 2-trifluoromethylacrylate) was obtained from Central Glass, Inc. and was used as received. BHFACHVE (3,5-bis(hexafluoro-2-hydroxy-2-propyl)cyclohexyl vinyl ether) was obtained from Central Glass, Inc. and was used as received.

VENBHFA(5-[(1',1',1'-trifluoro-2'-trifluoromethyl-2'-hydroxy)propyl]norbornan-2-yl vinyl ether) was synthesized prior to its use per the following procedure. To a 3-necked 500-mL round-bottomed flask equipped with a condenser (nitrogen inlet), a digital thermometer, and a magnetic stir bar was added 173.2 g (0.63 mol) of NBHFA and 100 g (1.9 mol) of formic acid (88%). The mixture was heated at 100° C. under nitrogen overnight. The resulting yellow solution was evaporated on a rotary evaporator leaving a thick yellow oil to which was added 120 mL of concentrated ammonium hydroxide (28%).

The mixture then was heated with stirring at 60° C. overnight. After cooling, the layers were separated and the lower layer was diluted with 500 mL of diethyl ether and washed sequentially with 5% (v/v) HCl (2×250 mL), water (2×200 mL), and brine. The ether solution was dried over $MgSO_4$, and evaporated and distilled at 92° C. at 0.8 mm Hg to yield 156 g (84%) of 2-hydroxy-5-[(1',1',1'-trifluoro-2'-trifluoromethyl-2'-hydroxy)propyl]norbornane as a clear, colorless oil.

To a 1-L 3-necked round-bottomed flask equipped with a nitrogen inlet, digital thermometer and magnetic stir bar were added 100 g (0.34 mol) of the 2-hydroxy-5-[(1',1',1'-trifluoro-2'-trifluoromethyl-2'-hydroxy)propyl]norbornane, 400 g (5.5 mol) of ethyl vinyl ether, and 3.2 g (0.01 mol) of mercuric acetate. The solution was stirred at room temperature for 2 days. The resulting mixture was evaporated on a rotary evaporator, diluted with 500 mL of diethyl ether, and washed sequentially with saturated sodium bicarbonate, water and brine.

After stirring over anhydrous magnesium sulfate overnight, the suspension was filtered, the solvent removed on a rotary evaporator, and the resulting oil distilled twice from solid sodium bicarbonate at 96° C. at 0.5 mmHg. The best fractions were pooled to yield 54 g (50%) of the VENBHFA as a clear, colorless oil.

Example 1

General Synthesis of Copolymers and Terpolymers

Radical copolymerization of 2-trifluoromethylacrylic monomers with norbornene derivative and vinyl ethers were carried out at 60-75° C. in $N_2$, after deaeration, with 4 mol % 2,2'-azobis-(isobutyronitrile) (AIBN) as the initiator in bulk or in ethyl acetate (EtOAc). The copolymers were purified by repeating precipitation in hexanes and dried in a vacuum oven at room temperature or 50° C. overnight. Other co- and terpolymers were prepared in a similar fashion.

Example 2

Synthesis of the Polymer (6)

The polymer (6) was prepared from the polymerization of BHFACHTFMA with BHFACHVE per the following procedure.

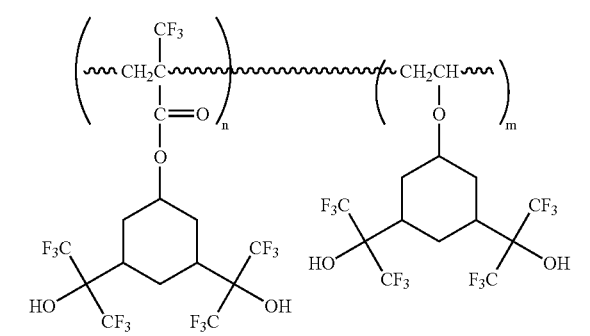

(6)

BHFACHTFMA (5.5519 g) and 0.1315 g of AIBN were added to 9.3694 g of 50% solution of BHFACHVE in EtOAc. After deaeration by bubbling $N_2$ for 30 min, the mixture was heated at 60° C. for 24 hrs. The mixture was cooled to room temperature and diluted with acetone. The polymer was precipitated in hexane and the solvent decanted. The solid polymer was dissolved in acetone and reprecipitated in hexane. The precipitated polymer was filtered, washed with hexane, and dried at 50° C. in a vacuum oven overnight. The product was the polymer (6) having a composition of acrylate/vinyl with n=0.57 and m=0.43. The weight-average molecular weight was 66,200 g/mol.

Example 3

Synthesis of the Polymer (7)

The polymer (7) was prepared from the polymerization of 3,5-bis(hexafluoro-2-hydroxy-2-propyl)cyclohexyl 2-trifluoromethylacrylate (BHFACHTFMA) with VENBHFA per the following procedure.

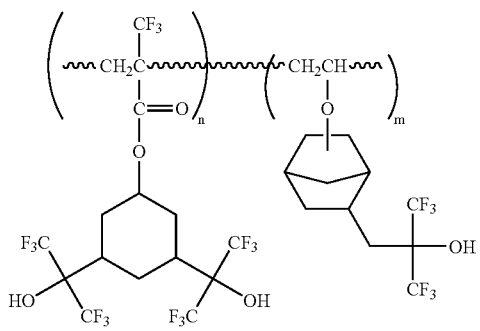

(7)

BHFACHTFMA (2.7744 g) and VENBHFA (1.6003 g) were dissolved in 2.0565 g of ethyl acetate, to which was added 0.0658 g of 2,2'-azobis-(isobutyronitrile) AIBN. The solution was deaerated by bubbling $N_2$ for 30 min and then heated at 60° C. for 24 hrs. After cooling to room temperature, the mixture was diluted with acetone and poured into hexane with stirring. The solvent was decanted and the remaining solid was dissolved in acetone. The polymer was reprecipitated in hexane. After decanting the solvent, the solid polymer was dried at room temperature under vacuum overnight. The product was the polymer (7) having a composition of acrylate/vinyl ether with n=0.61 and m=0.39. The weight-average molecular weight was 9,090 g/mol.

Example 4

Synthesis of the Polymers (4), (5), (8), and (9)

Polymers (4), (5), (8), and (9) were prepared according to the general procedure explained in Example 1 above, General Synthesis of Copolymers and Terpolymers.

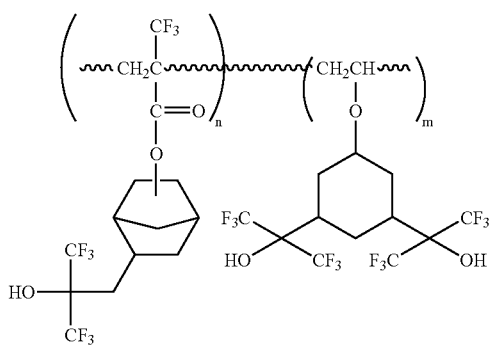

(4)

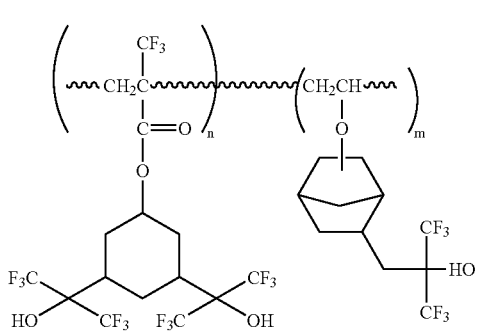

(5)

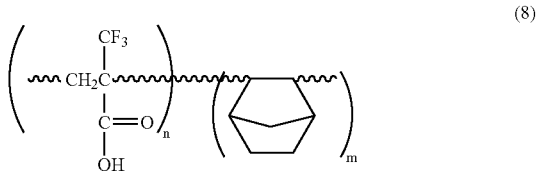

(8)

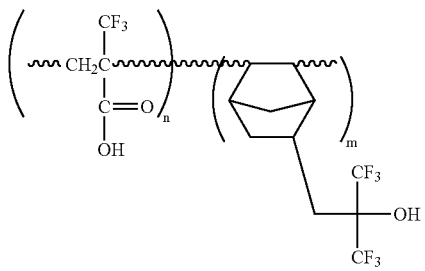

(9)

EXPERIMENTAL

The fluorine containing polymers (1), (2), and (4)-(9) typically have a weight-average molecular weight in a range from about 3,000 g/mol to about 100,000 g/mol as used in an embodiment of the present invention. Referring to the polymers (1), (2), and (4)-(9) wherein n and m represent respective molar fractions such that n+m=1 and wherein n is in a range from about 50 mole percent (mol. %) to about 75 mol. % and m is in a range from about 50 mol. % to about 25 mol. %. Further n is advantageously greater than m.

The fluorine-containing polymers (1), (2), and (4)-(9) are soluble in solvents such as an alcohol and an aqueous base. Examples of the alcohol include but are not limited to ethanol, n-propanol, isopropanol, n-butanol, sec-butanol, tert-butanol, isobutanol, n-pentanol, 2-pentanol, 3-pentanol, tert-pentanol, isopentanol, neopentanol, 2-methyl-1-pentanol, octanol, and combinations thereof.

Examples of the aqueous base include but are not limited to tetramethylammonium hydroxide (TMAH), an alkylammonium hydroxide, an arylammonium hydroxide, a Group (I) hydroxide, a Group (I) carbonate, and the like. Examples of the Group (I) hydroxide include but are not limited to LiOH, NaOH, KOH, and the like. Examples of the Group (I) carbonate include but are not limited to $Li_2CO_3$, $Na_2CO_3$, $K_2CO_3$, and the like.

The use of the aforementioned aqueous bases is not meant to limit the type of aqueous bases that may be used to dissolve the polymers (1), (2), and (4)-(9) in an embodiment of the present invention. Other aqueous bases that are capable of dissolving the polymers (1), (2), and (4)-(9), and compatible with the photolithographic system and the photoresists used (see FIG. 1 and description provided infra) may be used in accordance with the present invention.

A casting solvent is a solvent used to dissolve a polymer therein. The casting solvent with the dissolved polymer is then evenly spread or cast onto a substrate for use in photolithographic image processing. Casting solvents typically used for the polymers (1), (2), and (4)-(9) include ethanol, n-propanol, isopropanol, n-butanol, sec-butanol, tert-butanol, isobutanol, n-pentanol, 2-pentanol, 3-pentanol, tert-pentanol, isopentanol, neopentanol, 2-methyl-1-pentanol, octanol, and combinations thereof.

Various topcoat compositions comprising a fluorine-containing polymer represented by formula (1) or (2) and an alcohol are prepared by dissolving the polymers (1) or (2) in the alcohol (1 weight % to 10 weight % respectively). The choice of the alcohol may include but is not limited to ethanol, n-propanol, isopropanol, n-butanol, sec-butanol, tert-butanol, isobutanol, n-pentanol, 2-pentanol, 3-pentanol, tert-pentanol, isopentanol, neopentanol, 2-methyl-1-pentanol, octanol, and combinations thereof.

The polymer (1) or (2) broadly represent various other polymers by varying the substituents R, $R_1$, and $R_2$ in accordance with the present invention. The substituent R may be a fluoroalcohol, a Hydrogen atom, and the like. Examples of substituents represented by R include but are not limited to:

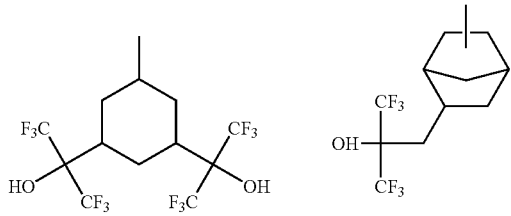

The substiuent $R_1$ may be fluoroalcohol group, a liner alkyl group, a branched alkyl group, a linear fluoroalkyl group, a branched fluoroalkyl group, a Hydrogen atom, or the like. Examples of substituents represented by $R_1$ include but are not limited to:

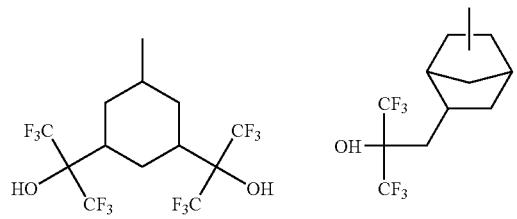

The substiuent $R_2$ may be fluoroalcohol group, a liner alkyl group, a branched alkyl group, a linear fluoroalkyl group, a branched fluoroalkyl group, a Hydrogen atom, or the like. Examples of substituents represented by $R_2$ include but are not limited to the formula (3):

$$-(CH_2)_p-C(CF_3)(CX_3)-OH \qquad (3)$$

wherein X is a Hydrogen atom or a Fluorine atom and p is 0 or 1

Varying the substituents R, $R_1$, or $R_2$ allows for different polymers to be combined with the alcohol of choice to form various topcoat compositions. For example a first topcoat composition comprising a fluorine-containing polymer represented by formula (4) and n-butanol is prepared by dissolving the polymer (4) in n-butanol (1 weight % to 10 weight % respectively).

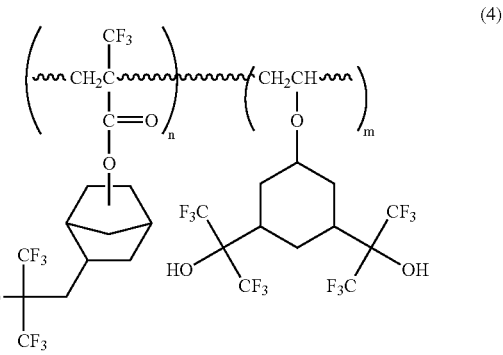

(4)

For example, adding 1 gram (g) of the fluorine-containing polymer (4) to 10 g of n-butanol and stirring gives one topcoat composition in an embodiment of the present invention. The amount of polymer (4) typically used in the topcoat composition may be in a range from about 1 g to 5 g and can be scaled up to a range from about 100 g to over 1 kilogram (kg). The amount of polymer (4) used is only dependent on the amount needed to form the first topcoat composition.

Similarly, a second topcoat composition comprising the polymer (5) and n-butanol may be prepared, as described above for preparation of the first topcoat composition.

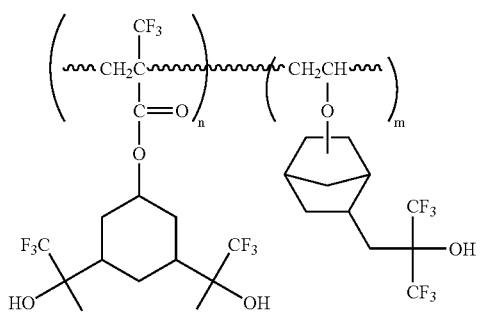

(5)

A third topcoat composition comprising the polymer (6) and n-butanol may be prepared, as described above for preparation of the first topcoat composition.

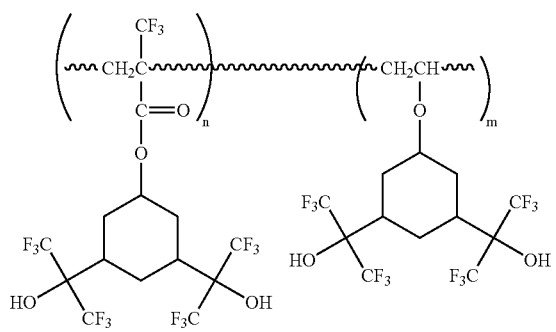

(6)

A fourth topcoat composition comprising the polymer (7) and n-butanol may be prepared, as described above for preparation of the first topcoat composition.

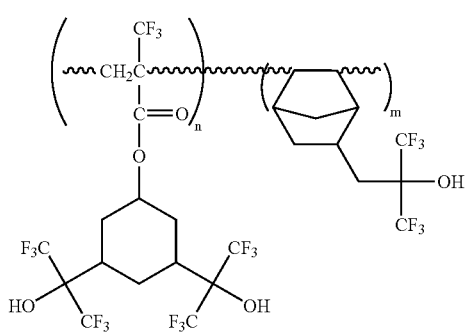

(7)

A fifth topcoat composition comprising the polymer (8) and n-butanol may be prepared, as described above for preparation of the first topcoat composition.

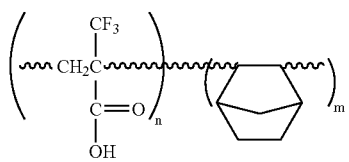

(8)

A sixth topcoat composition comprising the polymer (9) and n-butanol may be prepared, as described above for preparation of the first topcoat composition.

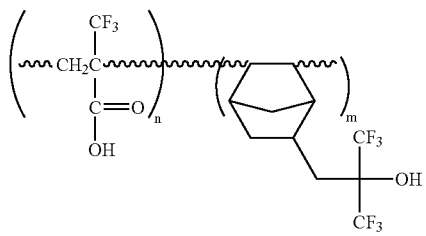

(9)

Further, other topcoat compositions comprising polymers, such as copolymers and terpolymers, formulated from the radical copolymerization of 2-trifluoromethylacrylic monomers with norbornene derivatives and vinyl ethers may be prepared as described above for the preparation of the first topcoat composition. During the radical copolymerization, the combination of 2-trifluoromethylacrylic monomers with norbornene derivatives and vinyl ethers can vary from 1 part 2-trifluoromethylacrylic monomer, one part norbornene deriveative, and one part vinyl ether; or 1 part 2-trifluoromethylacrylic monomer, 2 parts norbornene deriveatives, and 0 part vinyl ether; 0 part 2-trifluoromethylacrylic monomer, 1 part norbornene derivative, and 2 parts vinyl ether; and combinations thereof. The 2-trifluoromethylacrylic monomer can be used having different substituent groups as described above during the radical copolymerization process.

The amount of polymer (1), (2), and (4)-(9) and polymers formulated from radical copolymerization of 2-trifluoro-methylacrylic monomers with norbornene derivatives and vinyl ethers typically used in the respective topcoat composition may be in a range from about 1 g to 5 g and can be scaled up to a range from about 100 g to over 1 kilogram (kg). The amount of polymer (1), (2), and (4)-(9) and polymers formulated from radical copolymerization of 2-trifluoro-methylacrylic monomers with norbornene derivatives and vinyl ethers used is only dependent on the amount needed to form the respective topcoat composition.

Polymer concentrations of the polymers (1), (2), and (4)-(9) and polymers formulated from radical copolymerization of 2-trifluoromethylacrylic monomers with norbornene derivatives and vinyl ethers in the casting solvents described above can range from about 30% by weight to about 1% by weight depending on the molecular weight of the polymers (1), (2), and (4)-(9) and the thickness of the final topcoat material desired. A typical concentration of thin (30 nm -40 nm) topcoat materials range from about 1% by weight to about 3% by weight. The topcoat material thickness can vary from about 20 nm to about 3000 nm.

FIG. 1 depicts a diagram of an immersion photolithographic system that may be used to process a semiconductor wafer with a topcoat composition in an embodiment of the present invention. Referring to FIG. 1, an immersion lithography system 100 includes a controlled environment chamber 105 and a controller 110. Contained within the environment chamber 105 is a focusing mirror 115, a light source 120, a first focusing lens (or set of lenses) 125, a mask 130, an exposure slit 135, a second focusing lens (or set of lenses) 140, a final focusing lens 145, an immersion head 150, and a wafer chuck 155.

The immersion head 150 includes a transparent window 160, a central chamber portion 165, a surrounding plate portion 170, an immersion fluid inlet 175A and an immersion fluid outlet 175B. An immersion fluid 185 fills the central chamber portion 165 and contacts a photoresist layer 186 on a top surface 188 of a wafer 190. The photoresist layer 186 includes a topcoat 196 formed from a topcoat composition, described supra, in an embodiment of the present invention. In one example, the immersion fluid 185 is water. The plate portion 170 is positioned close enough to the photoresist layer 186 to form a meniscus 192 under the plate portion 170. The window 160 is transparent to the wavelength of light selected to expose the photoresist layer 186.

The focusing mirror 115, the light source 120, the first focusing lens 125, a mask 130, the exposure slit 135, the second focusing lens 140, the final focusing lens 145, the immersion head 150 are all aligned along an optical axis 200 which also defines a Z direction. An X direction is defined as a direction orthogonal to the Z direction and in the plane of the drawing. A Y direction is defined as a direction orthogonal to both the X and Z directions.

The wafer chuck 155 may be moved in the X and Y directions under the direction of the controller 110 to allow formation of exposed regions and unexposed regions of the photoresist in the photoresist layer 186. As an XY-stage moves, new portions of photoresist layer 186 are brought into contact with the immersion fluid 185 and previously immersed portions of the photoresist layer 186 are removed from contact with the immersion fluid 185. The mask 130 and the slit 135 may be moved in the Y direction under the control of the controller 110 to scan the image (not shown) on the mask 130 onto the photoresist layer 186. In one example, the image on the mask 130 is a 1× to a 10× magnification version of the image to be printed and includes one or multiple integrated circuit chip images.

When exposure is complete, the wafer 190 is removed from the controlled environment chamber 105 without spilling the immersion fluid 185. To this end, the controlled environment chamber 105 also includes a cover plate 195 that may be moved to first abut with the wafer chuck 155 and then move with the wafer chuck 155 as the wafer chuck 155 is moved out of position from under the immersion head 150 with the cover plate replacing the wafer chuck 155 under the immersion head 150.

The immersion photolithographic system described above is not meant to limit the types of photolithographic systems that may be used in accordance with the present invention. Other systems such as air (dry) photolithographic systems and maskless interferometric lithography systems are compatible with the compositions and methods of the present invention. For example, maskless systems do not use a photomask when exposing the photoresist to radiation. The radiation still changes the chemical composition of the regions of the photoresist exposed to the radiation, forming exposed and unexposed regions in the photoresist. Further, radiation sources capable of producing photolithographic images and/or latent images are also compatible with the compositions and methods of the present invention. For example, electron beam radiation.

A method of forming an image on a photoresist is presented in accordance with the present invention. A 193 nanometer (nm) single layer photoresist was formed on two substrates (silicon (Si) wafers). The Si wafers employed and all Si wafers used in the following experiments were coated with a bottom anti-reflection coating prior to applying the photoresist layer. The photoresist layer was spin coat applied onto the Si wafers and followed with a post photoresist apply bake at 100° C. for 90 sec. The post photoresist apply bake is also known as a pre-exposure bake or pre-bake, and is performed to remove the photoresist solvent. The topcoat composition comprising the fluorine-containing polymer (6), as described supra, was cast, i.e. applied, onto one of the Si wafers having the photoresist layer. The topcoat composition was prepared as previously described.

The topcoat composition was spin coat applied onto the photoresist layer of one Si wafer at 1,500 rotations per minute (rpm) for 60 seconds and at a baking temperature of 90° C. During the baking process the casting solvent is evaporated from the topcoat composition resulting in the formation of a topcoat material over the photoresist layer. The entire Si wafer having the single layer photoresist and topcoat material is referred to as a stack. The topcoat composition may be applied onto the single layer photoresist using alternative methods such as spraying, dip coating, and the like.

The stack then was exposed to 193 nm radiation through the photomask of the immersion photolithographic system process described supra and depicted in FIG. 1. The photomask has regions that are opaque and transparent to the radiation. Irradiation of the photoresist layer through the photomask produces exposed and unexposed regions of the photoresist layer. The exposed regions of the photoresist layer have a change in the chemical composition due to the radiation.

The stack then was post expose baked at 110° C. for 90 sec. and was developed with 0.26 normal (N) TMAH for 60 sec. The TMAH developer removed the topcoat material and selectively removed either the exposed region or the unexposed region of the photoresist layer to produce an image on the Si wafer. The stack comprising of the Si wafer and the single layer photoresist only also was exposed to 193 nm radiation, post expose baked at 110° C. for 90 sec, and developed with 0.26 N TMAH for 60 sec. also producing an image on the Si wafer.

The use of an aqueous base such as TMAH in the developing stage is to remove the topcoat material and selectively either the exposed region or the unexposed region of the photoresist layer from the Si wafer. Other aqueous bases that may be used include but are not limited to an alkylammonium hydroxide, an arylammonium hydroxide, a Group (I) hydroxide, a Group (I) carbonate, and the like. Examples of the Group (I) hydroxide include but are not limited to LiOH, NaOH, KOH, and the like. Examples of the Group (I) carbonate include but are not limited to $Li_2CO_3$, $Na_2CO_3$, $K_2CO_3$, and the like.

Figure 2:
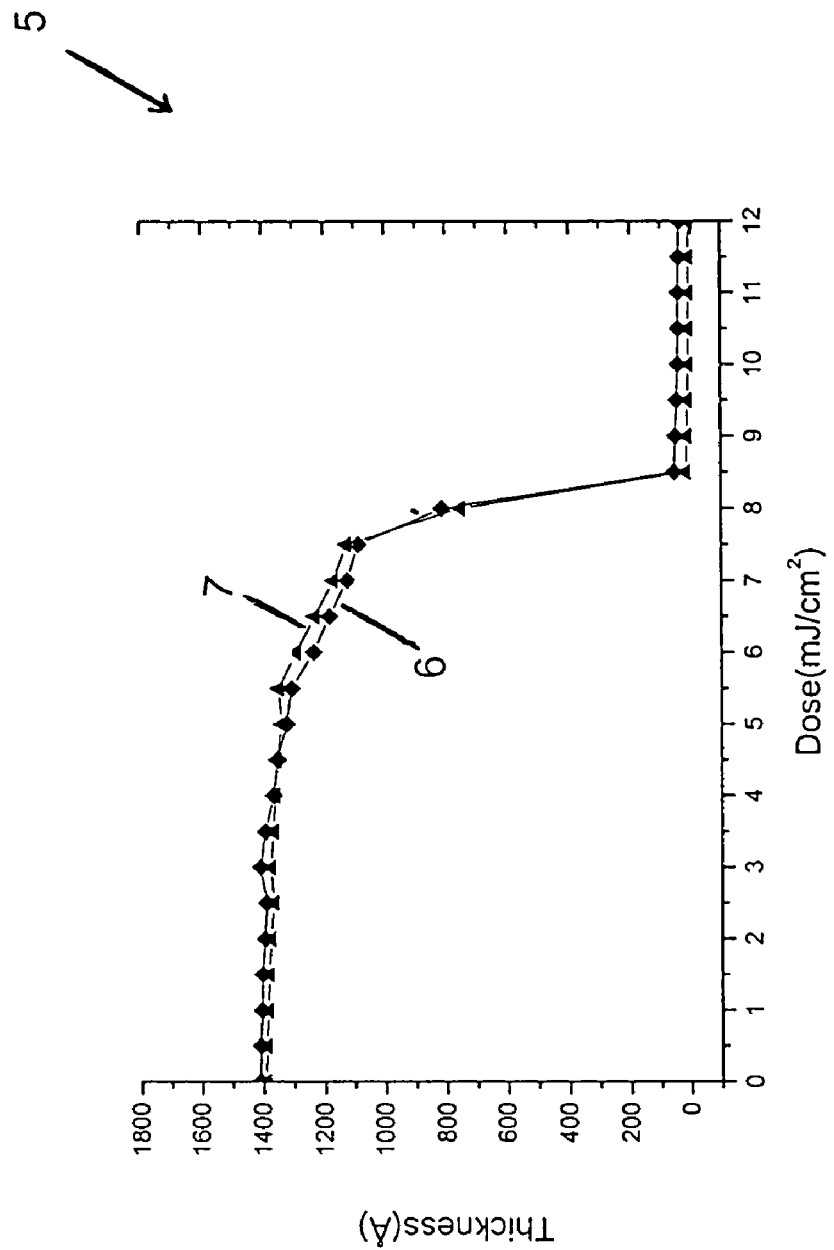
FIG. 2 depicts a plot of contrast curves of a photoresist layer with a first topcoat material cast from n-butanol and without a topcoat material, in accordance with the present invention.

During the photolithographic imaging process described above, the change in thickness, after development of the photoresist layers, of the two wafers was measured as a function of irradiation dosage. FIG. 2 depicts a plot 5 of contrast curves of a photoresist layer without a topcoat material and with a topcoat material cast from n-butanol (described supra) in an embodiment of the present invention.

Referring to FIG. 2, the plot 5 is of photoresist layer thickness in angstroms (Å) versus radiation dose in milliJoules/ centimeter$^2$ (mJ/cm$^2$). Contrast curve 6 is the photoresist layer without the topcoat composition that was irradiated and developed with TMAH. Contrast curve 7 is the photoresist layer with the topcoat material cast from n-butanol having the polymer (7) therein with subsequent irradiation and development.

Examination of the plot 5 demonstrates the viability of the topcoat compositions described above and the resultant topcoat materials for use in the immersion photolithography process. Contrast curve 7, with the topcoat material, varied little from the contrast curve 6, without the topcoat material, after irradiation and development. Contrast curves 6 and 7 are nearly identical indicating the absence of any significant interference of the topcoat material with the exposure of the photoresist to the radiation and the development step of the photolithography process.

Figure 3:
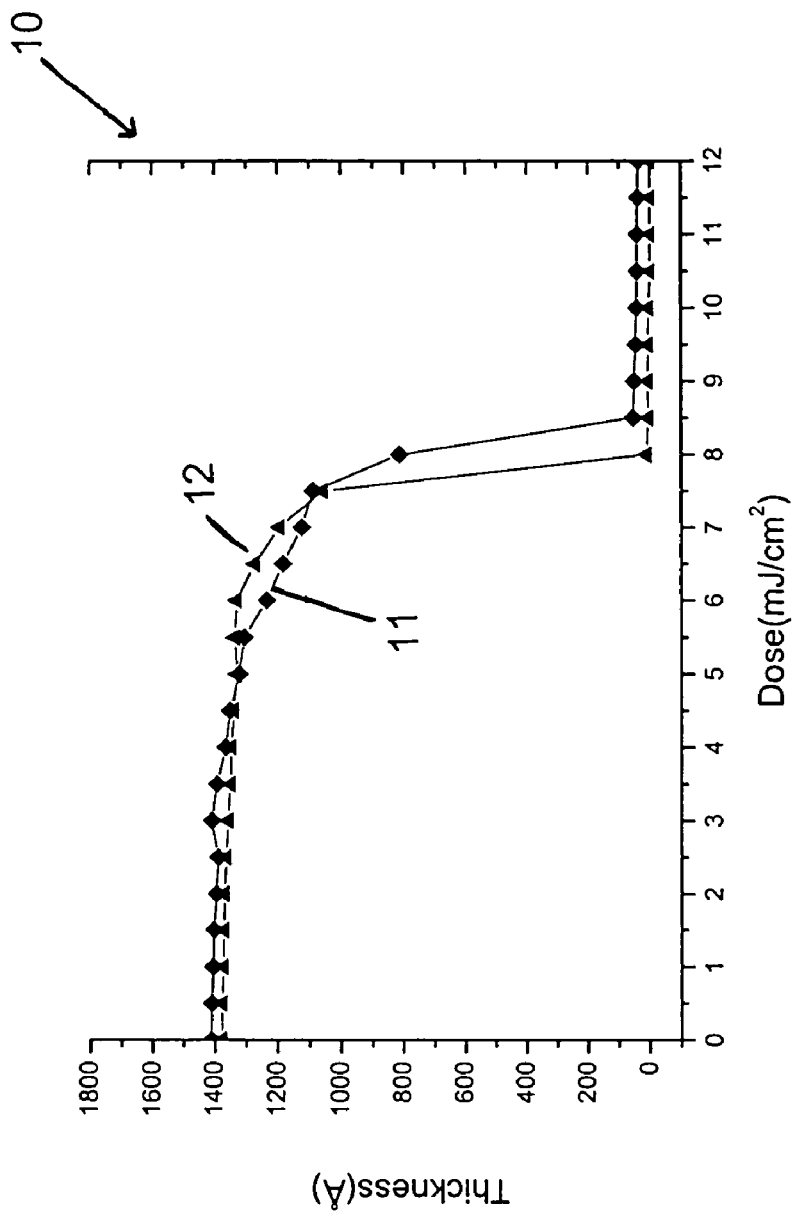
FIG. 3 depicts a plot of contrast curves of a photoresist layer with a second topcoat material cast from n-butanol and without a topcoat material, in accordance with the present invention.

Referring to FIG. 3, the plot 10 is of photoresist layer thickness in angstroms (Å) versus radiation dose in milli-Joules/centimeter$^2$ (mJ/cm$^2$). Contrast curve 11 is the photoresist layer without the topcoat composition that was irradiated and developed with TMAH. Contrast curve 12 is the photoresist layer with the topcoat material cast from n-butanol having the polymer (9) therein with subsequent irradiation and development.

Examination of the plot 10 demonstrates the viability of the topcoat compositions described above and the resultant topcoat materials for use in the immersion photolithography process. Contrast curve 12, with the topcoat material, varied little from the contrast curve 11, without the topcoat material, after irradiation and development. Contrast curves 11 and 12 are nearly identical indicating the absence of any significant interference of the topcoat material with the exposure of the photoresist to the radiation and the development step of the photolithography process.

Figure 4:
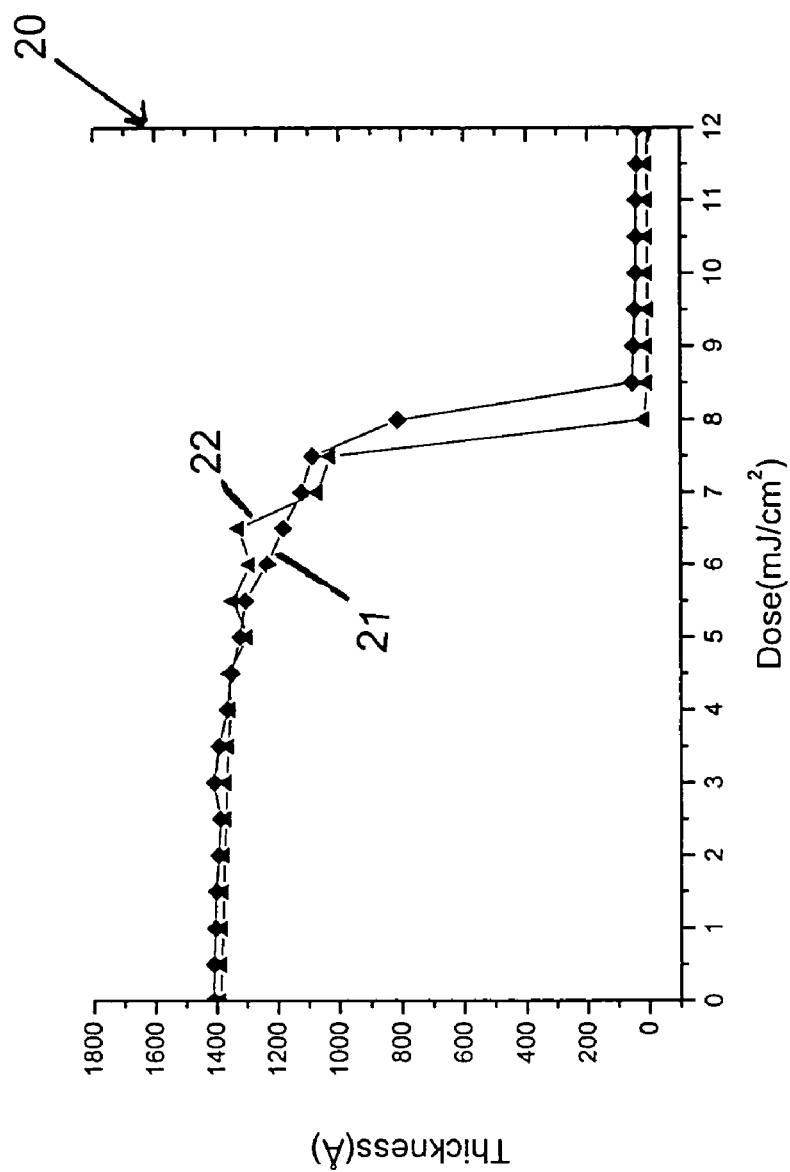
FIG. 4 depicts a plot of contrast curves of a photoresist layer with a third topcoat material cast from n-butanol and without a topcoat material, in accordance with the present invention.

Referring to FIG. 4, the plot 20 is of photoresist layer thickness in angstroms (Å) versus radiation dose in milli-Joules/centimeter$^2$ (mJ/cm$^2$). Contrast curve 21 is the photoresist layer without the topcoat composition that was irradiated and developed with TMAH. Contrast curve 22 is the photoresist layer with the topcoat material cast from n-butanol having the polymer (4) therein with subsequent irradiation and development.

Examination of the plot 20 demonstrates the viability of the topcoat compositions described above and the resultant topcoat materials for use in the immersion photolithography process. Contrast curve 22, with the topcoat material, varied little from the contrast curve 21, without the topcoat material, after irradiation and development. Contrast curves 21 and 22 are nearly identical indicating the absence of any significant interference of the topcoat material with the exposure of the photoresist to the radiation and the development step of the photolithography process.

Figure 5:
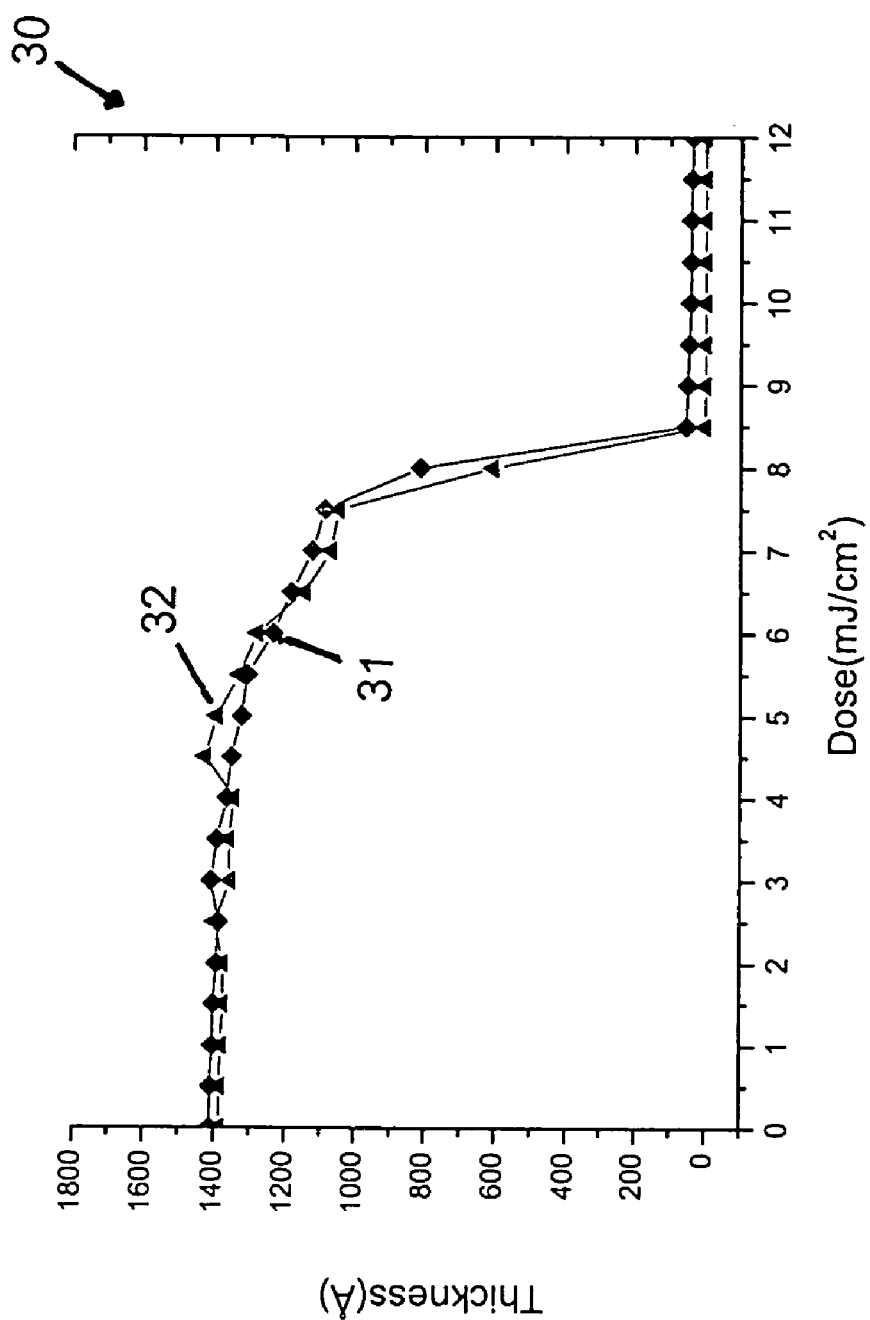
FIG. 5 depicts a plot of contrast curves of a photoresist layer with a fourth topcoat material cast from n-butanol and without a topcoat material, in accordance with the present invention.

Referring to FIG. 5, the plot 30 is of photoresist layer thickness in angstroms (Å) versus radiation dose in milli-Joules/centimeter$^2$ (mJ/cm$^2$). Contrast curve 31 is the photoresist layer without the topcoat composition that was irradiated and developed with TMAH. Contrast curve 32 is the photoresist layer with the topcoat material cast from n-butanol having the polymer (4) therein with subsequent irradiation and development.

Examination of the plot 30 demonstrates the viability of the topcoat compositions described above and the resultant topcoat materials for use in the immersion photolithography process. Contrast curve 32, with the topcoat material, varied little from the contrast curve 31, without the topcoat material, after irradiation and development. Contrast curves 31 and 32 are nearly identical indicating the absence of any significant interference of the topcoat material with the exposure of the photoresist to the radiation and the development step of the photolithography process.

Figure 6:
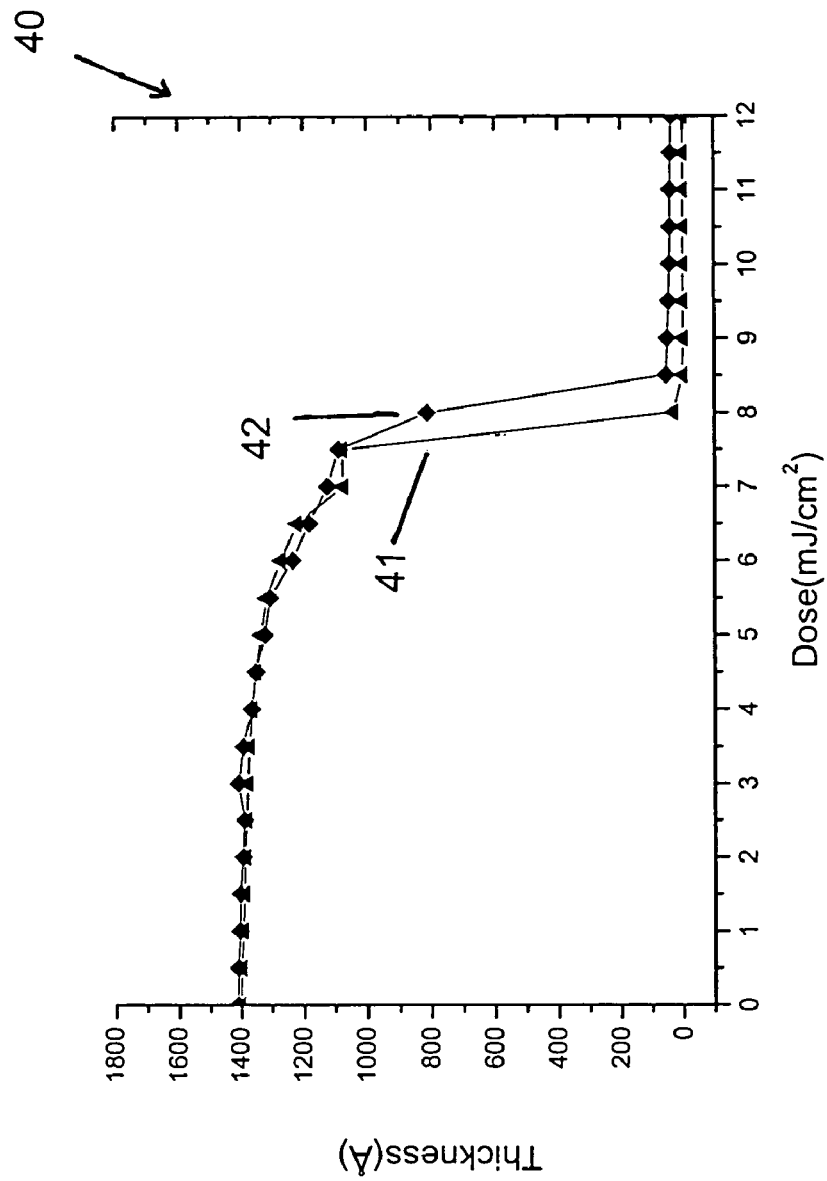
FIG. 6 depicts a plot of contrast curves of a photoresist layer with a fifth topcoat material cast from n-butanol and without a topcoat material, in accordance with the present invention.

Referring to FIG. 6, the plot 40 is of photoresist layer thickness in angstroms (Å) versus radiation dose in milli-Joules/centimeter$^2$ (mJ/cm$^2$). Contrast curve 41 is the photoresist layer without the topcoat composition that was irradiated and developed with TMAH. Contrast curve 42 is the photoresist layer with the topcoat material cast from n-butanol having the polymer (6) therein with subsequent irradiation and development.

Examination of the plot 40 demonstrates the viability of the topcoat compositions described above and the resultant topcoat materials for use in the immersion photolithography process. Contrast curve 42, with the topcoat material, varied little from the contrast curve 41, without the topcoat material, after irradiation and development. Contrast curves 41 and 42 are nearly identical indicating the absence of any significant interference of the topcoat material with the exposure of the photoresist to the radiation and the development step of the photolithography process.

While the topcoat compositions and topcoat materials in an embodiment of the present invention, as described above, were used in context with a single layer photoresist, they also have utility in the photolithography process with bilayer photoresists and bilayer platforms.

Photoresist layer integrity during topcoat composition application and subsequent photolithographic processing is critical. Significant thinning of the photoresist layer often occurs when the casting solvent of a topcoat composition dissolves portions of the photoresist layer. Great care must be taken in choosing a topcoat composition compatible with the photoresist. The casting solvent of the topcoat composition should be miscible with the topcoat material to allow consistent and uniform application of the topcoat material onto a photoresist layer yet be essentially immiscible with the photoresist layer to prevent thinning or other degradation of the photoresist layer.

Figure 7A:
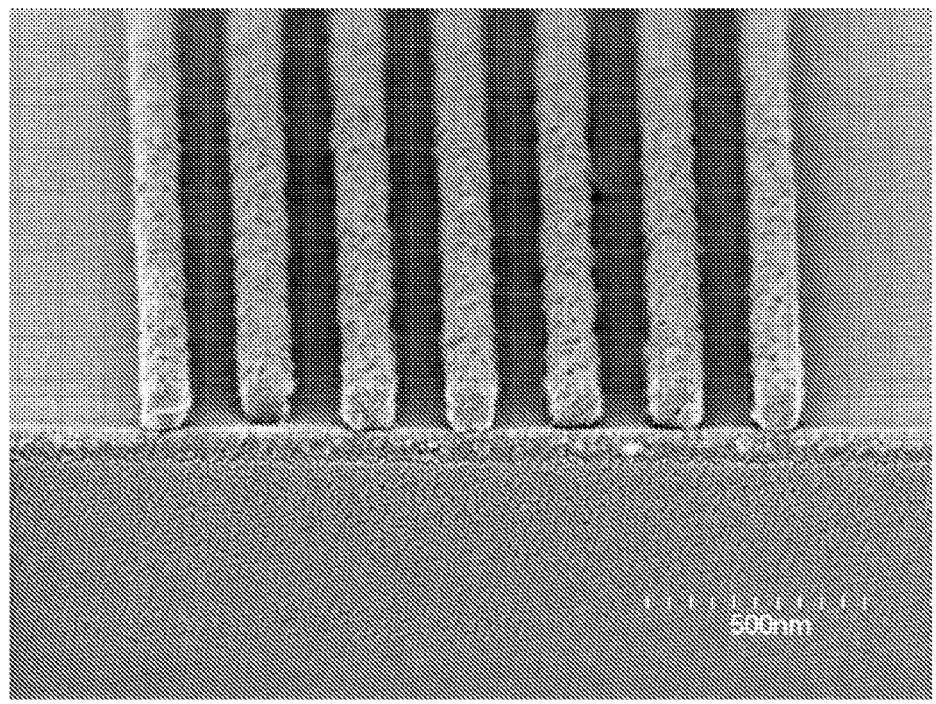
FIG. 7A is an electron micrograph of a single layer photoresist pattern (120 nm 1:1 lines/spaces) formed in air without a topcoat, in accordance with the present invention.

FIG. 7A is an electron micrograph of a single layer photoresist pattern (120 nm 1:1 line/spaces) formed by dry (air) lithography without a topcoat. A 140 nm thick layer of a single layer photoresist was formed on a 5 inch silicon wafer. The wafer was post apply baked at 110° C. for 90 seconds. The wafer was exposed in water to radiation having a wavelength of 193 nm and then post expose baked at 110° C. for 90 seconds. The wafer was subsequently developed for 60 seconds in 0.26 N TMAH.

Figure 7B:
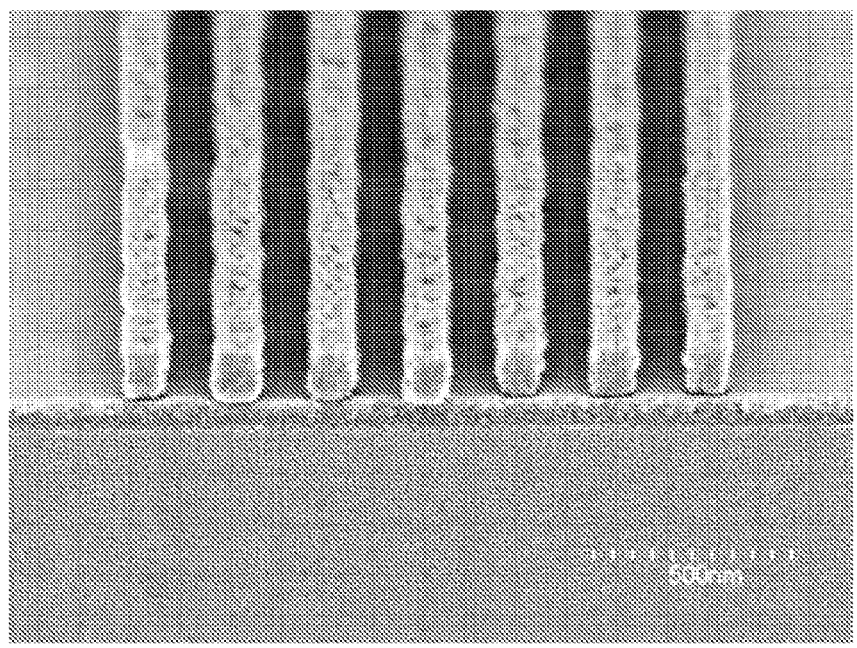
FIG. 7B is an electron micrograph of a single layer photoresist pattern (120 nm 1:1 lines/spaces) formed in air with a topcoat material cast from n-butanol, in accordance with the present invention.

FIG. 7B is an electron micrograph of a single layer photoresist pattern (120 nm 1:1 line/spaces) formed by dry (air) lithography lithography with a topcoat material cast from n-butanol in an embodiment of the present invention. A 140 nm thick layer of a bilayer photoresist was formed on a 5 inch silicon wafer. The wafer was post apply baked at 110° C. for 90 seconds. A solution of the topcoat composition comprising the polymer (7) in n-butanol was spin cast applied onto the photoresist layer and baked at 90° C. for 60 seconds to form the topcoat covering the photoresist layer. The wafer was exposed in water to radiation having a wavelength of 193 nm and then post expose baked at 110° C. for 90 seconds. The wafer was subsequently developed for 60 seconds in 0.26 N TMAH.

Comparing the electron micrograph of FIG. 7A to the electron micrograph of FIG. 7B illustrates that the photoresist image formed from the photoresist layer with a topcoat (FIG. 7B) had a comparable image to the image formed from the photoresist layer without a topcoat (FIG. 7A). No degradation of the photoresist layer with a topcoat in FIG. 7B can be seen.

In fact, improved performance can be observed in that the photoresist layer having a topcoat produced an image with a squarer photoresist profile, with less rough edges, and less thickness loss than the image from the photoresist layer without a topcoat material.

Figure 8A:
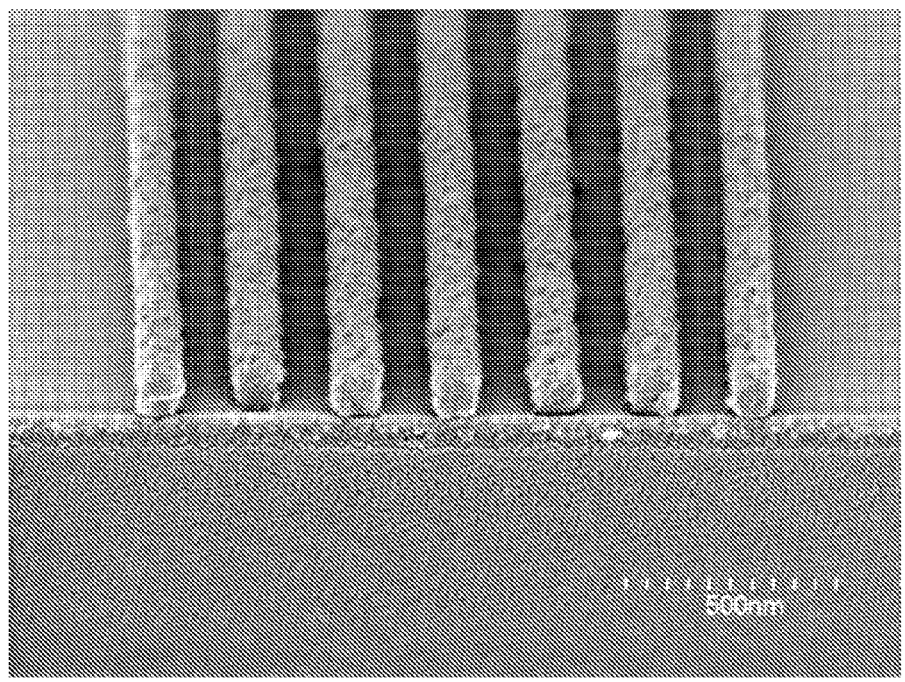
FIG. 8A is an electron micrograph of a single layer photoresist pattern (130 nm 1:1 lines/spaces) formed in air without a topcoat, in accordance with the present invention.

FIG. 8A is an electron micrograph of a single layer photoresist pattern (130 nm 1:1 line/spaces) formed by dry (air) lithography without a topcoat. A 140 nm thick layer of a single layer photoresist was formed on a 5 inch silicon wafer. The wafer was post apply baked at 110° C. for 90 seconds. The wafer was exposed in water to radiation having a wavelength of 193 nm and then post expose baked at 110° C. for 90 seconds. The wafer was subsequently developed for 60 seconds in 0.26 N TMAH.

Figure 8B:
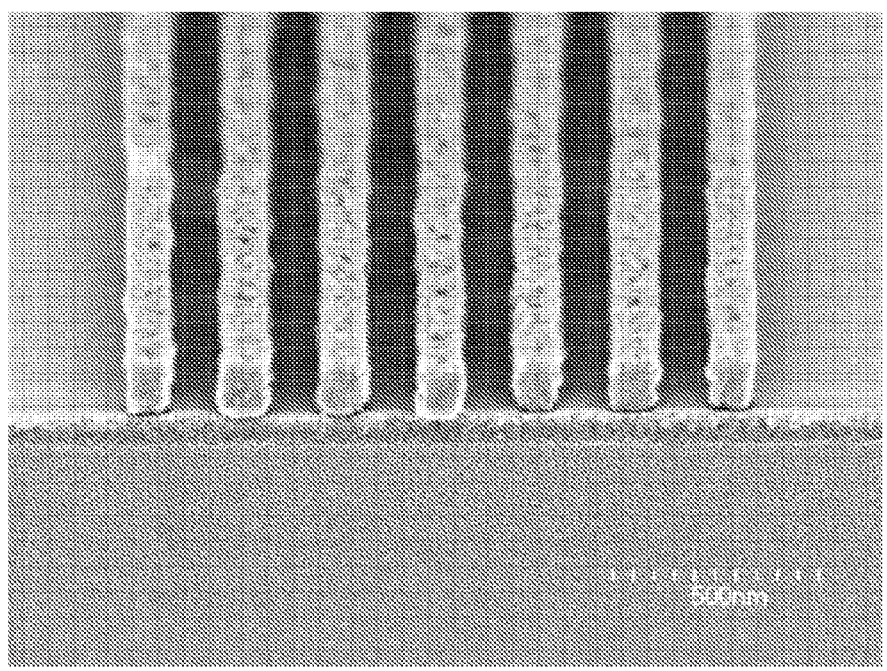
FIG. 8B is an electron micrograph of a single layer photoresist pattern (130 nm 1:1 lines/spaces) formed in air with a topcoat material cast from n-butanol, in accordance with the present invention.

FIG. 8B is an electron micrograph of a single layer photoresist pattern (130 nm 1:1 line/spaces) formed by dry (air) lithography lithography with a topcoat material cast from n-butanol in an embodiment of the present invention. A 140 nm thick layer of a bilayer photoresist was formed on a 5 inch silicon wafer. The wafer was post apply baked at 110° C. for 90 seconds. A solution of the topcoat composition comprising the polymer (7) in n-butanol was spin cast applied onto the photoresist layer and baked at 90° C. for 60 seconds to form the topcoat covering the photoresist layer. The wafer was exposed in water to radiation having a wavelength of 193 nm and then post expose baked at 110° C. for 90 seconds. The wafer was subsequently developed for 60 seconds in 0.26 N TMAH.

Comparing the electron micrograph of FIG. 8A to the electron micrograph of FIG. 8B illustrates that the photoresist image formed from the photoresist layer with a topcoat (FIG. 8B) had a comparable image to the image formed from the photoresist layer without a topcoat (FIG. 8A). No degradation of the photoresist layer with a topcoat in FIG. 8B can be seen. In fact, improved performance can be observed in that the photoresist layer having a topcoat produced an image with a squarer photoresist profile, with less rough edges, and less thickness loss than the image from the photoresist layer without a topcoat material.

While the topcoat compositions and topcoat materials of the present invention as described above were used in context with dry (air) photolithography, they also have utility with immersion water photolithography.

The results above are not limited to a single layer photoresist pattern with 120 nm lines/spaces. One would expect the same performance enhancement with no degradation for a single layer photoresist of varying patterns in accordance with the present invention. For example, single layer photoresist patterns having 130 nm lines/space, 140 nm lines/space, and other photoresist patterns are compatible with the compositions and the methods of the present invention.

Further, one would expect the same performance enhancement with no degradation for a bilayer photoresist of varying patterns in accordance with the present invention. For example, bilayer photoresist patterns having 120 nm lines/spaces, 130 nm lines/space, 140 nm lines/space, and other photoresist patterns are compatible with the compositions and the methods of the present invention.

While the topcoat compositions and the topcoat materials described to this point have been in the context of utility with single, bilayer, and trilayer photoresists, and utility within the photolithography process, the topcoat compositions and the topcoat materials of the present invention also have utility as a protective coating against environmental contamination from particulates, water vapor, and chemical vapors that could degrade the imaging process or cause imperfections in the photoresist images, and ultimately yield defects in the fabricated product.

The topcoat material substantially prevent out-gassing of molecules from the photoresist into the process medium used to form a photolithographic image on the photoresist and prevents diffusion of substances from the process medium into the photoresist. The elimination of out-gassed molecules substantially prevents the contamination of the lens component used in the photolithographic process.

Further, the topcoat material substantially prevents leaching of photoresist components into the process medium used to from a photolithographic image on the photoresist. The elimination of leached photoresist components also prevents the contamination of the lens component used in the photolithographic process.

The topcoat materials of the present invention have an added benefit in that they may be used as a top anti-reflection coating (ARC). Typically in the photolithographic process (see FIG. 1), a bottom ARC is formed on the top surface 188 of the photoresist wafer 190. In an embodiment of the present invention, the top ARC is formed on the top surface 196 of the photoresist layer 186.

The foregoing description of the embodiments of this invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of this invention as defined by the accompanying claims.

What is claimed is:

1. A topcoat composition composing:
   a copolymer having at least a 2-trifluoromethylacrylic repeating unit containing a hexafluoroalcohol group or hydrogen, wherein said copolymer is soluble in an alcohol and an aqueous base; and
   a casting solvent comprising said alcohol, wherein said copolymer includes a fluorine-containing copolymer represented by the formula (4):

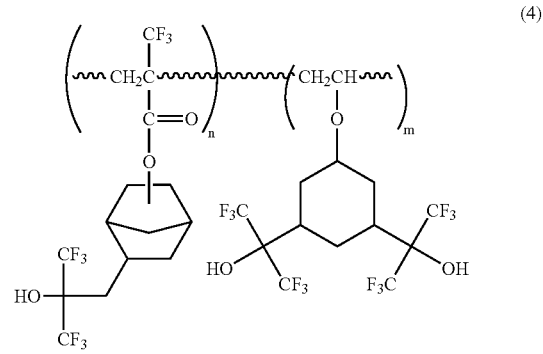

wherein n and m represent respective molar fractions such that n +m =1.

2. The composition of claim 1, wherein said alcohol is selected from the group consisting of ethanol, n-propanol, isopropanol, n-butanol, sec-butanol, tert-butanol, isobutanol, n-pentanol, 2-pentanol, 3-pentanol, tert-pentanol, isopentanol, neopentanol, 2-methyl-1-pentanol, octanol, and combinations thereof.

3. The composition of claim 1, wherein said aqueous base is selected from the group consisting of tetramethylammonium hydroxide, an alkylammonium hydroxide, a Group (I) hydroxide, a Group (I) carbonate, and combinations thereof.

4. A topcoat composition comprising:
a copolymer having at least a 2-trifluoromethylacrylic repeating unit containing a hexafluoroalcohol group or hydrogen, wherein said copolymer is soluble in an alcohol and an aqueous base; and
a casting solvent comprising said alcohol, wherein said copolymer includes a fluorine-containing copolymer represented by the formula (5):

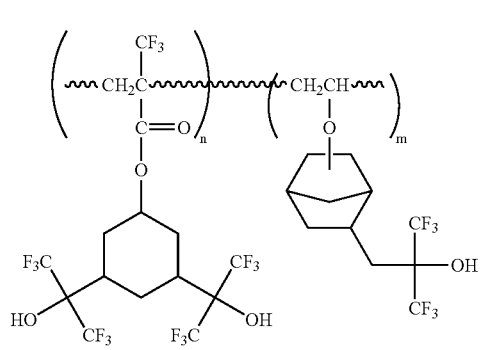

(5)

wherein n and m represent respective molar fractions such that n +m =1.

5. The composition of claim 4, wherein said alcohol is selected from the group consisting of ethanol, n-propanol, isopropanol, n-butanol, sec-butanol, tert-butanol, isobutanol, n-pentanol, 2-pentanol, 3-pentanol, tert-pentanol, isopentanol, neopentanol, 2-methyl-1-pentanol, octanol, and combinations thereof.

6. The composition of claim 4, wherein said aqueous base is selected from the group consisting of tetramethylammonium hydroxide, an alkylammonium hydroxide, a Group (I) hydroxide, a Group (I) carbonate, and combinations thereof.

7. A topcoat composition comprising:
a copolymer having at least a 2-trifluoromethylacrylic repeating unit containing a hexafluoroalcohol group or hydrogen, wherein said copolymer is soluble in an alcohol and an aqueous base; and
a casting solvent comprising said alcohol, wherein said copolymer includes a fluorine-containing copolymer represented by the formula (6):

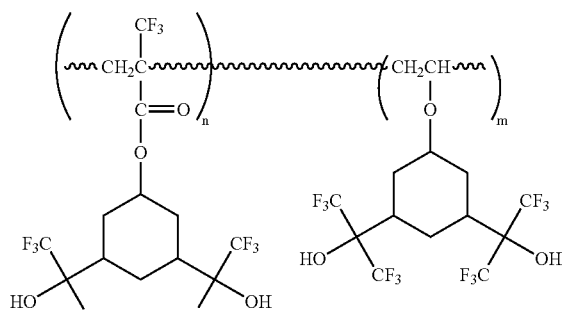

(6)

wherein n and m represent respective molar fractions such that n +m =1.

8. The composition of claim 7, wherein said alcohol is selected from the group consisting of ethanol, n-propanol, isopropanol, n-butanol, sec-butanol, tert-butanol, isobutanol, n-pentanol, 2-pentanol, 3-pentanol, tert-pentanol, isopentanol, neopentanol, 2-methyl-1-pentanol, octanol, and combinations thereof.

9. The composition of claim 7, wherein said aqueous base is selected from the group consisting of tetramethylammonium hydroxide, an alkylammonium hydroxide, a Group (I) hydroxide, a Group (I) carbonate, and combinations thereof.

* * * * *